United States Patent
Mulder et al.

(10) Patent No.: US 8,836,915 B2
(45) Date of Patent: Sep. 16, 2014

(54) LITHOGRAPHIC APPARATUS, A METHOD OF CONTROLLING THE APPARATUS AND A DEVICE MANUFACTURING METHOD

(75) Inventors: Pieter Mulder, Duizel (NL); Jan Willem Cromwijk, Best (NL); Jimmy Matheus Wilhelmus Van De Winkel, Kessel (NL); Marjan Leonardus Catharina Hoofman, Eindhoven (NL); Ferdinand Bernardus Johannus Wilhelmus Maria Hendriks, Wijchen (NL)

(73) Assignee: ASML Netherlands B.V., Veldhoven (NL)

( * ) Notice: Subject to any disclaimer, the term of this patent is extended or adjusted under 35 U.S.C. 154(b) by 157 days.

(21) Appl. No.: 13/403,798

(22) Filed: Feb. 23, 2012

(65) Prior Publication Data
US 2012/0218534 A1    Aug. 30, 2012

Related U.S. Application Data

(60) Provisional application No. 61/446,849, filed on Feb. 25, 2011, provisional application No. 61/472,050, filed on Apr. 5, 2011.

(51) Int. Cl.
*G03B 27/42*    (2006.01)
*G03B 27/52*    (2006.01)
*G03F 7/20*    (2006.01)

(52) U.S. Cl.
CPC .................. *G03F 7/70341* (2013.01)
USPC .............................. 355/53; 355/30

(58) Field of Classification Search
CPC .................................. G03F 7/70341
USPC .................................. 355/30, 53, 72; 250/548
See application file for complete search history.

(56) References Cited

U.S. PATENT DOCUMENTS

| 4,509,852 | A  | 4/1985 | Tabarelli et al. |
| 7,330,238 | B2 | 2/2008 | Van Der Toorn et al. |

(Continued)

FOREIGN PATENT DOCUMENTS

| EP | 1 420 300 | 5/2004 |
| EP | 1 477 856 | 11/2004 |

(Continued)

OTHER PUBLICATIONS

Japanese Office Action mailed Feb. 25, 2013 in corresponding Japanese Patent Application No. 2012-032987.

(Continued)

*Primary Examiner* — Hung Henry Nguyen
(74) *Attorney, Agent, or Firm* — Pillsbury Winthrop Shaw Pittman LLP

(57) ABSTRACT

An immersion lithographic apparatus is disclosed having a projection system configured to direct a patterned beam of radiation onto a substrate and a liquid handling system configured to supply and confine immersion liquid to a space defined between the projection system and a substrate, or a substrate table, or both. A controller is provided to adjust an angle of a lower surface of the liquid handling system relative to the top surface of the substrate during motion of the substrate and/or substrate table relative to the liquid handling system dependent upon a position of the substrate and/or substrate table relative to the liquid handling system and/or a direction of relative movement between the substrate and/or substrate table and the liquid handling system.

19 Claims, 18 Drawing Sheets

(56) References Cited

U.S. PATENT DOCUMENTS

| | | |
|---|---|---|
| 7,468,779 B2 | 12/2008 | De Graaf et al. |
| 7,633,073 B2 | 12/2009 | Jansen et al. |
| 7,929,112 B2 | 4/2011 | De Graaf et al. |
| 8,405,817 B2 * | 3/2013 | Stavenga et al. ............... 355/53 |
| 2004/0136494 A1 | 7/2004 | Lof et al. |
| 2004/0207824 A1 | 10/2004 | Lof et al. |
| 2005/0007569 A1 | 1/2005 | Streefkerk et al. |
| 2005/0259233 A1 | 11/2005 | Streefkerk et al. |
| 2006/0038968 A1 | 2/2006 | Kemper et al. |
| 2006/0119809 A1 | 6/2006 | Verhagen et al. |
| 2006/0215131 A1 | 9/2006 | Van Der Toorn et al. |
| 2006/0232753 A1 | 10/2006 | Khmelichek et al. |
| 2006/0290908 A1 | 12/2006 | De Graaf et al. |
| 2007/0114451 A1 | 5/2007 | Jansen et al. |
| 2007/0114452 A1 | 5/2007 | Jansen et al. |
| 2007/0188733 A1 | 8/2007 | Ito et al. |
| 2008/0212046 A1 | 9/2008 | Riepen et al. |
| 2009/0104568 A1 * | 4/2009 | Hirukawa ..................... 430/322 |
| 2009/0262318 A1 | 10/2009 | Van Den Dungen et al. |
| 2009/0279060 A1 | 11/2009 | Direcks et al. |
| 2009/0279062 A1 | 11/2009 | Direcks et al. |
| 2010/0060868 A1 | 3/2010 | Tanasa et al. |
| 2010/0214543 A1 | 8/2010 | Stavenga et al. |
| 2010/0214544 A1 | 8/2010 | Sewell et al. |
| 2011/0188015 A1 | 8/2011 | De Graaf et al. |
| 2012/0019801 A1 | 1/2012 | Simons et al. |

FOREIGN PATENT DOCUMENTS

| | | |
|---|---|---|
| JP | 2005-303167 | 10/2005 |
| JP | 2007-013150 | 1/2007 |
| JP | 2007-150308 | 6/2007 |
| JP | 2009-021498 | 1/2009 |
| JP | 2010-199582 | 9/2010 |
| JP | 2010-219510 | 9/2010 |
| KR | 10-2007-0077119 | 7/2007 |
| WO | 99/49504 | 9/1999 |
| WO | 2005/064405 | 7/2005 |

OTHER PUBLICATIONS

Korean Office Action dated Mar. 24, 2014 in corresponding Korean Patent Application No. 10-2012-0019137.

* cited by examiner

LITHOGRAPHIC APPARATUS, A METHOD OF CONTROLLING THE APPARATUS AND A DEVICE MANUFACTURING METHOD

This application claims priority and benefit under 35 U.S.C. §119(e) to U.S. Provisional Patent Application Ser. No. 61/446,849, entitled "A Lithographic Apparatus, A Method Of Controlling The Apparatus and A Device Manufacturing Method", filed on Feb. 25, 2011, and to U.S. Provisional Patent Application Ser. No. 61/472,050, entitled "A Lithographic Apparatus, A Method Of Controlling The Apparatus and A Device Manufacturing Method", filed on Apr. 5, 2011. The contents of those applications are incorporated herein in their entirety by reference.

FIELD

The present invention relates to a lithographic apparatus, a method of controlling the lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

In immersion lithography the force between a liquid handling system and the substrate table is generally constant except when the liquid handling system is over a gap between the substrate and the substrate table. The force jump experienced in this position can lead to a servo error in the z direction of the substrate table. Servo error in the z direction of the substrate table may lead to defocusing error.

It is desirable, for example, to reduce or eliminate the risk of such defocusing error.

According to an aspect, there is provided an immersion lithographic apparatus comprising: a substrate table configured to support a substrate; a projection system configured to direct a patterned beam of radiation onto a substrate; a liquid handling system configured to supply and confine immersion liquid to a space defined between the projection system and a substrate, or the substrate table, or both; a controller to adjust an angle of a lower surface of the liquid handling system relative to the top surface of the substrate during motion of the substrate and/or substrate table relative to the liquid handling system dependent upon a position of the substrate and/or substrate relative to under the liquid handling system and/or a direction of relative movement between the substrate and/or substrate table and the liquid handling system.

According to an aspect, there is provided a method of operating a lithographic apparatus, the method comprising: moving a substrate table supporting a substrate relative to a projection system configured to project a patterned beam of radiation through immersion liquid confined by a liquid handling system onto a substrate; and adjusting an angle of a lower surface of the liquid handling system relative to the top surface of the substrate during motion of the substrate and/or substrate table relative to the liquid handling system dependent upon a position of the substrate and/or substrate table relative to the liquid handling system and/or a direction of relative movement between the substrate and/or substrate table and the liquid handling system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
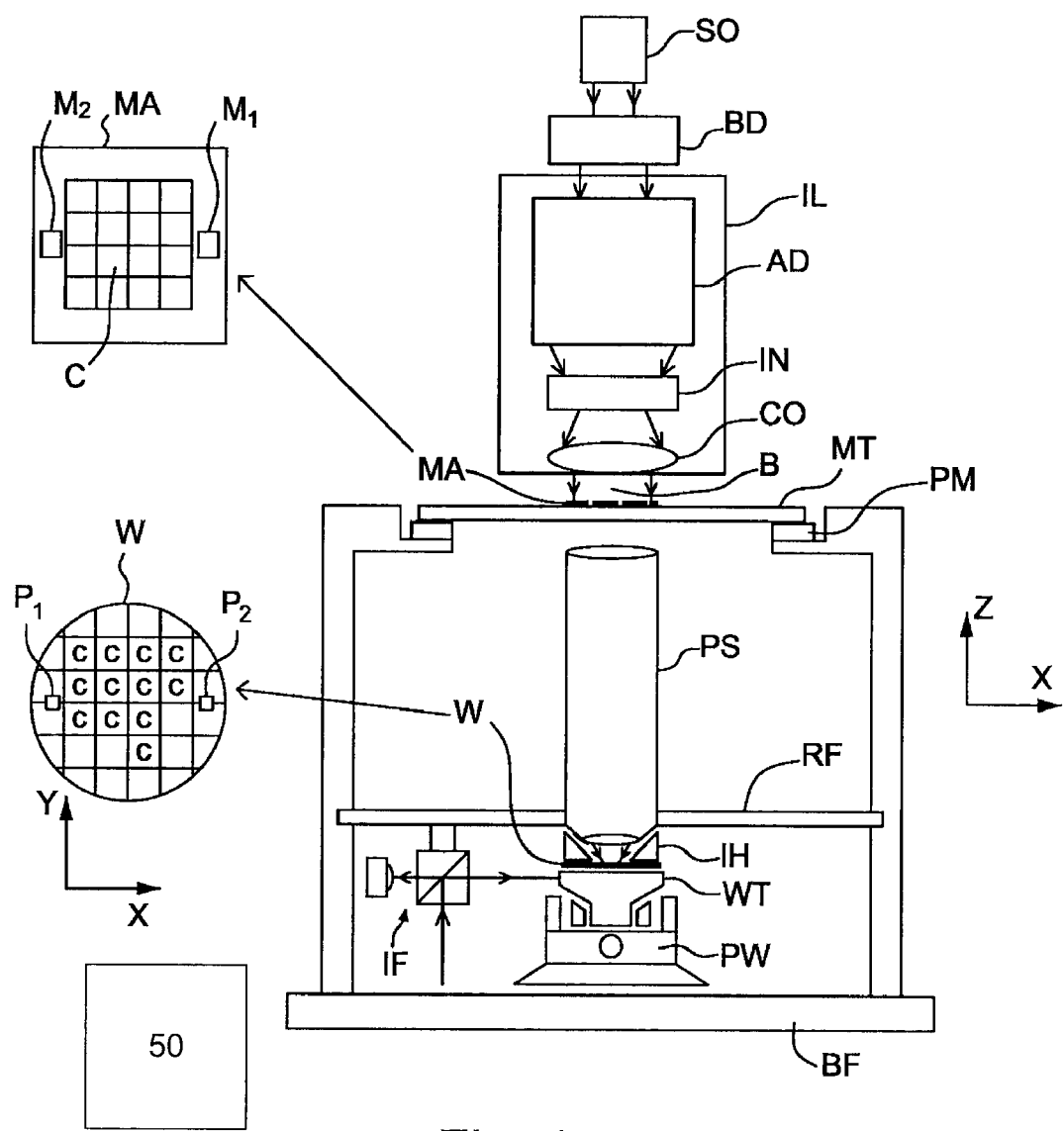
FIG. 1 depicts a lithographic apparatus according to an embodiment of the invention.

FIG. 1 schematically depicts a lithographic apparatus according to one embodiment of the invention. The apparatus comprises:
an illumination system (illuminator) IL configured to condition a radiation beam B (e.g. UV radiation or DUV radiation);
a support structure (e.g. a mask table) MT constructed to support a patterning device (e.g. a mask) MA and connected to a first positioner PM configured to accurately position the patterning device MA in accordance with certain parameters;
a substrate table (e.g. a wafer table) WT constructed to hold a substrate (e.g. a resist-coated wafer) W and connected to a second positioner PW configured to accurately position the substrate W in accordance with certain parameters; and
a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stages or supports), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stages or supports) which may be used in parallel in a similar manner to substrate, sensor and/or measurement tables.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, as in other modes, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above. In an embodiment a programmable mirror array may be used to optimize the projection beam (and not create the patterning device (e.g., mask) pattern).

Combinations and/or variations on the above described modes of use or entirely different modes of use may also be employed.

Arrangements for providing liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area.

Figure 2:
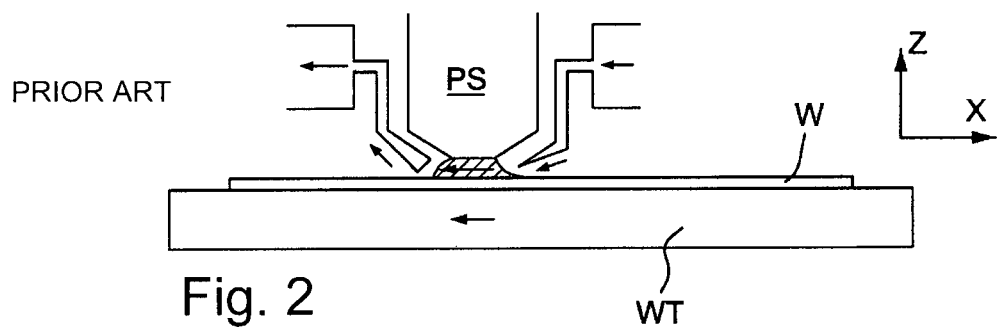
FIGS. 2 and 3 depict a liquid supply system for use in a lithographic projection apparatus.
Figure 3:
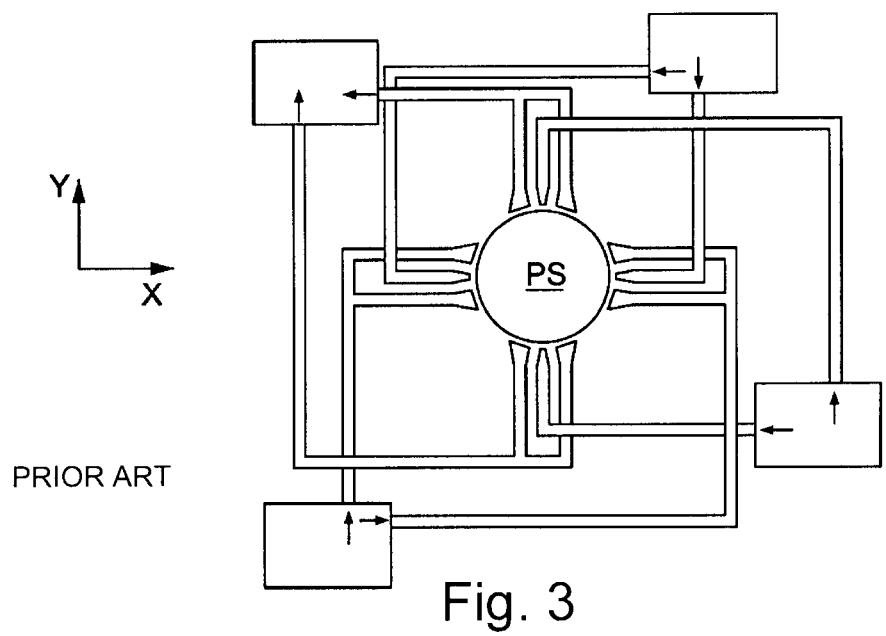

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
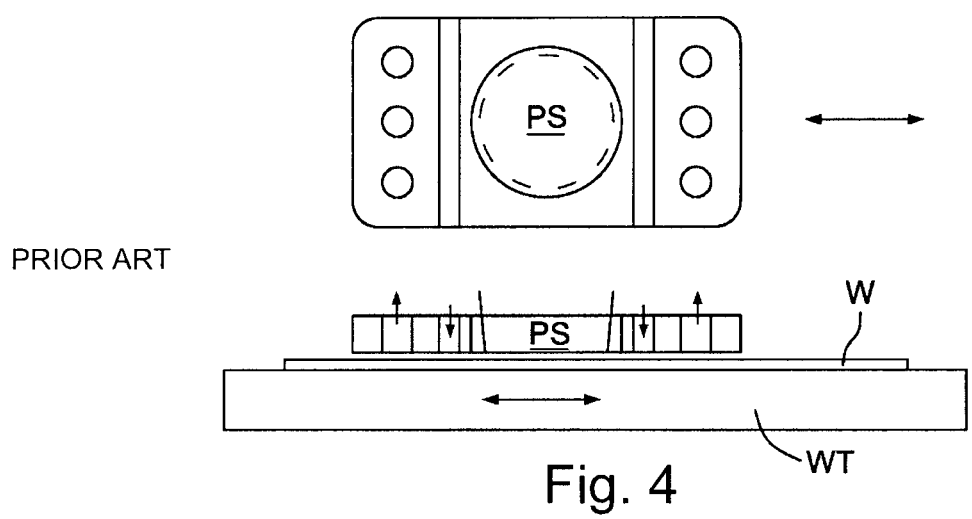
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak (or flow) over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

Any of the liquid supply devices of FIGS. 2-5 may be used in an all wet system; however, sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

Figure 5:
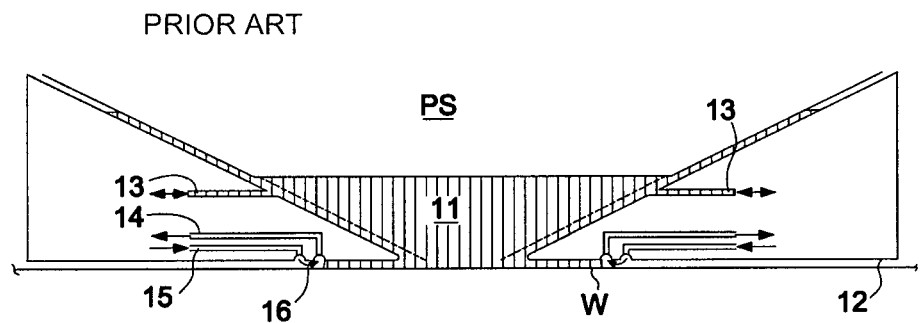
FIG. 5 depicts a further liquid supply system for use in a lithographic projection apparatus.

Another arrangement which has been proposed is to provide the liquid supply system with a fluid confinement structure. The fluid confinement structure may extend along at least a part of a boundary of the space between the final element of the projection system and the substrate table. Such an arrangement is illustrated in FIG. 5. The fluid confinement structure is substantially stationary relative to the projection system in the XY plane though there may be some relative movement in the Z direction (in the direction of the optical axis). A seal is formed between the fluid confinement structure and the surface of the substrate. In an embodiment, a seal is formed between the fluid confinement structure and the surface of the substrate and may be a contactless seal such as a gas seal. Such a system is disclosed in United States patent application publication no. US 2004-0207824.

FIG. 5 schematically depicts a localized liquid supply system or fluid handling structure or device with a liquid confinement structure 12 (or body) forming a barrier member or fluid confinement structure, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The fluid handling structure is substantially stationary relative to the projection system PS in the XY plane though there may be some relative movement in the Z direction (in the direction of the optical axis). In an embodiment, a seal is formed between the liquid confinement structure 12 and the surface of the substrate W and may be a contactless seal such as a gas seal or fluid seal.

The liquid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the liquid confinement structure 12 positioned below and surrounding the final element of the projection system PS. Liquid is brought into the space 11 below the projection system PS and within the liquid confinement structure 12 by liquid inlet 13. The liquid may be removed by liquid outlet 13. The liquid confinement structure 12 may extend a little above the final element of the projection system PS. The liquid level rises above the final element so that a buffer of liquid is provided. In an embodiment, the liquid confinement structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid is contained in the space 11 by the gas seal 16 which, during use, is formed between the bottom of the liquid confinement structure 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968. In an embodiment, a single or two phase extractor may comprise an inlet which is covered in a porous material. In an embodiment of a single phase extractor the porous material is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 300 µm, desirably 5 to 50 µm. In an embodiment, the porous material is at least slightly liquidphilic (e.g., hydrophilic), i.e. having a contact angle of less than 90° to the immersion liquid, e.g. water.

Another arrangement which is possible is one which works on a gas drag principle. The so-called gas drag principle has been described, for example, in United States patent application publication no. US 2008-0212046 and United States patent application publication nos. US 2009-0279060 and US 2009-0279062. In that system the extraction holes are arranged in a shape which desirably has a corner. The corner may be aligned with the stepping or scanning directions. This reduces the force on the meniscus between two openings in the surface of the fluid handing structure for a given speed in the step or scan direction compared to if the two outlets were aligned perpendicular to the direction of scan.

Also disclosed in US 2008-0212046 is a gas knife positioned radially outside the main liquid retrieval feature. The gas knife traps liquid which gets past the main liquid retrieval feature. Such a gas knife may be present in a so called gas drag principle arrangement (as disclosed in US 2008-0212046), in a single or two phase extractor arrangement (such as disclosed in United States patent application publication no. US 2009-0262318) or any other arrangement.

An embodiment of the invention may be applied to a fluid handling structure used in an all wet immersion apparatus. In the all wet embodiment, fluid is allowed to cover the whole of the top surface of the substrate table, for example, by allowing liquid to leak out of a confinement structure which confines liquid to between the final element of projection system and the substrate. An example of a fluid handling structure for an all wet embodiment can be found in United States patent application publication no. US 2010-0060868.

Many other types of liquid supply system are possible. The present invention is not limited to any particular type of liquid supply system. The present invention may be advantageous for use with a confined immersion system in which the liquid between the final element of the projection system and the substrate is confined, for example, in optimizing the use. However, the invention can be used with any other type of liquid supply system.

Figure 6:
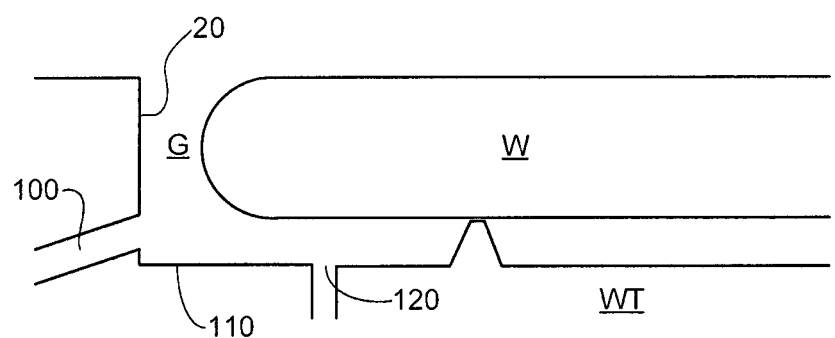
FIG. 6 depicts, in cross-section, an edge of a substrate and the surrounding substrate table.

As illustrated in FIG. 6, a substrate holder may be used to support the substrate W. The substrate table WT supports the substrate holder. The substrate holder may be in a recess within the substrate table WT. The depth of the recess may be sized so that when a substrate W is present on the substrate holder the surface of the substrate W is substantially coplanar with the top surface of the substrate table WT. When a substrate W is present on the substrate support, there may be a gap G between the substrate W edge and a facing edge 20 of the substrate table.

In the gap G, there may be a defined gap opening, which in an embodiment may be a plurality of gap openings 100, of a fluid extraction device to remove liquid from the gap G during operation. The gap opening 100 may be located near the edge of the recess (e.g. at a radially outward position to the substrate W). An opening (or one or more under-openings 120) may be present at or near the periphery 110 of the substrate support. This opening may be covered by a substrate W during operation, so that liquid may be removed from under the substrate W through the under opening 120.

A problem with the localized area supply solution is that when an edge of the substrate is imaged, the gap G moves relative to at least a portion of the fluid handling system (e.g. liquid confinement structure 12). For many types of fluid handling system (the present invention is applicable to all types of fluid handling system, particularly the localized area fluid handling system) a change in force between the fluid handling system and the substrate table occurs upon such relative movement with respect to the gap G. This results in a substrate table servo error in the z direction, which means that the substrate table WT is not correctly positioned in the z direction (the direction of the optical axis) compared to the desired position.

Figure 7:
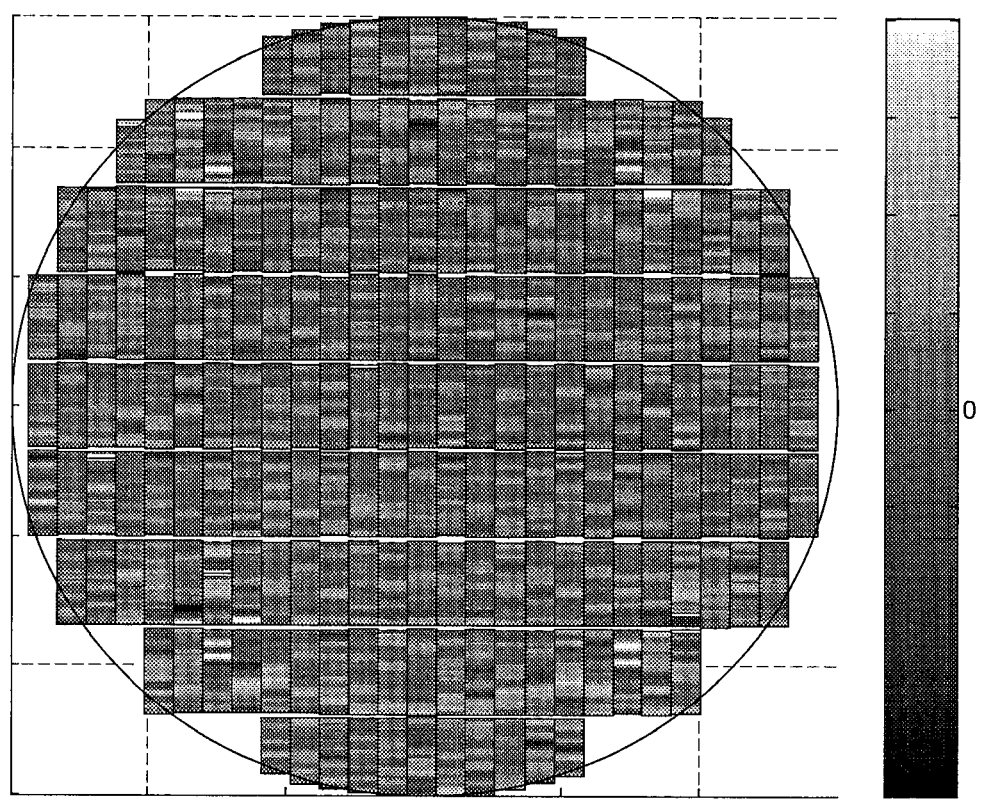
FIG. 7 illustrates experimental results of substrate table servo error in the z direction without using an embodiment of the present invention as a plan view of a substrate (the lightest and darkest shading illustrating highest servo error)

FIG. 7 is a chart indicating in gray scale how far from the desired position the position of the substrate table is, in the z direction. As can be seen from FIG. 7, there are certain dies, particularly dies at the top two corners just in from the substrate edge and in a region around the bottom of the substrate just in from the substrate edge which have a particularly large servo error in the z direction (either positive (white) or negative (black)). A servo error in the z direction, if left uncorrected, leads to defocus of an image imaged on an affected die. The pattern the defocused dies make is an artifact of the order in which the dies are imaged. Any dies imaged before or after crossing of the gap G under the liquid confinement system might be affected.

The z-direction servo error is associated with the change in force between the substrate table WT and the fluid handling structure as the gap G passes under the fluid handling structure. In a quasi static situation (for example a relative velocity between the fluid handling system and the substrate table of 10 mm/s) the change in force is about 0.3 N. In a scanning situation (with a velocity of 610 mm/s) the force jump is greater at about 0.6 N.

Servo error in the z direction can result in defocus and thus imaging error.

A solution to the problem of defocus is to slow scanning speed down at dies/fields which might be affected. This gives the substrate table actuator a chance to account for the change in force and thereby help prevent z-direction servo error. However, this occurs at the expense of throughput.

A different strategy is to measure the force disturbance on a dummy substrate, particularly for the fields when the fluid handling system crosses the gap G. This measurement can be used in the positioning system of the substrate table during exposure of production substrates. However, this solution has throughput cost and its effectiveness is questionable. However, such an arrangement (for example disclosed in Unites States patent application publication no. US 2012-0019801, which is incorporated herein in its entirety by reference), can be used in combination with an embodiment of the present invention.

Note this problem may be less relevant for an all-wet immersion system where immersion liquid covers at least the entirety of the surface of the substrate W and desirably some of the surrounding surface of the substrate table WT. However, there may be similar systematic errors in such a system and an embodiment of the present invention may be applied to such a system. For example, a substrate edge may pass under a fluid supply structure of an all-wet immersion system.

In an embodiment of the invention a controller 50 is configured to adjust one or more operating conditions of the lithographic apparatus. For example, the controller may be configured to adjust one or more operating conditions of the liquid confinement structure 12 and/or of the positioning system PW configured to position the substrate W and/or substrate table WT relative to the projection system PS and/or liquid confinement structure 12. Therefore the controller 50 changes one or more operating conditions from the operating conditions determined by one or more main controllers. That is, the controller 50 sets the one or more operating conditions to be different to the operating conditions which would be selected in absence of the controller 50.

A higher distance between the bottom surface of the liquid confinement structure 12 and the substrate W and/or substrate table WT (the distance is sometimes termed the fly height) may mean a smaller variation in force when crossing the gap G and thereby a smaller servo error in the z direction of the substrate table WT and thereby the smaller the defocus problem. However, increasing the fly height of the whole liquid confinement structure 12 may not be possible because that may increase defectivity. Generally the lower the fly height the better from a defectivity point of view. An increase in fly height may result in an increase in liquid left behind on the surface under the liquid confinement structure 12. Liquid left behind on the surface can, on collision with a meniscus extending between the liquid confinement structure 12 and the surface, result in bubbles being generated in the immersion liquid between the projection system and the substrate. These bubbles can interfere with the projection beam, leading to imaging defects. Thus, increasing the fly height could lead to increased defectivity.

An embodiment of the present invention tilts the liquid confinement structure 12 (so that there is an angle different than zero degrees between the lower surface of the liquid confinement structure 12 relative to the surface of the substrate W). Therefore, it is possible to increase the fly height of the liquid confinement structure 12 at positions where a higher fly height is needed while leaving the fly height of the liquid confinement structure 12 at a nominal (e.g. predetermined) magnitude at a different position.

Generally the fly height is increased on the advancing side of the liquid confinement structure 12 (the advancing side is the side from which the substrate table WT is moving) and maintained at the nominal (e.g. predetermined) value at the receding side of the liquid confinement structure 12 (the receding side is the side to which the substrate table WT is moving).

The direction and magnitude of tilt of the liquid confinement structure 12 depends on the direction of relative movement between the liquid confinement structure 12 and the substrate table WT (e.g. the scan or step direction) and/or the position of the liquid confinement structure 12 relative to the substrate W.

In an embodiment tilt of the liquid confinement structure 12 is only induced when the liquid confinement structure 12 is at the edge of a substrate W.

In an embodiment, the tilt is induced such that the liquid confinement structure 12 bottom surface is rotated towards the edge of the substrate (e.g. so that the radially outer edge (relative to the substrate W) of the undersurface of the liquid confinement structure 12 is further from the top surface of the substrate W than the inner edge).

In an embodiment the tilt is around an axis with a direction with at least a component substantially parallel to the local edge of the substrate.

In an embodiment the tilt may be different depending upon whether the liquid confinement structure 12 crosses onto or off from the substrate. The direction and amount of tilt may change from die-to-die (e.g. field-to-field).

In an embodiment the tilt is around an axis with a direction with a least a component substantially perpendicular to a direction of relative movement between the liquid confinement structure 12 and the substrate W.

Figure 8:
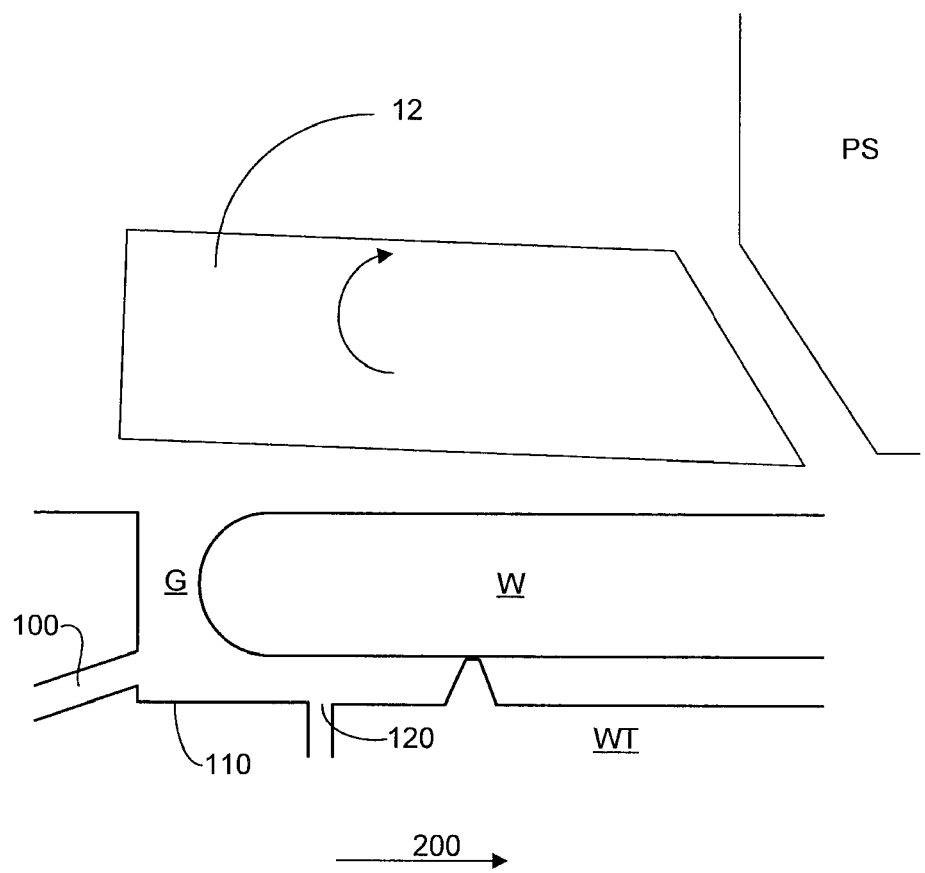
FIG. 8 illustrates, in cross-section, a fluid handling system above the gap between a substrate and the substrate table.

FIG. 8 illustrates a typical example of how the liquid confinement structure 12 is tilted relative to the substrate W during crossing of the left hand edge of the liquid confinement structure 12 (as illustrated) off from the substrate. In this embodiment, arrow 200 indicates movement of the substrate table WT relative to the stationary liquid confinement structure 12.

As illustrated a leading edge of the liquid confinement structure 12 has a larger fly height compared to a (non-illustrated) trailing edge of the liquid confinement structure 12. Therefore, there is a larger gap between the liquid confinement structure 12 at a position over the gap G than elsewhere. As a result, a lower variation in force between the liquid confinement structure 12 and the substrate table WT is experienced as the liquid confinement structure 12 passes over the gap G than would be the case if the fly height were lower at the leading edge. As a result, a smaller servo error in the z direction of the substrate table WT can be expected and thereby a smaller defocus.

An embodiment of the invention can be seen as a routing for the substrate W under the projection system PS in which the tilt of the liquid confinement structure 12 is determined continually or semi-continually (e.g. for each field (die)). Alternatively or additionally, the tilt is dependent on the position and/or direction of relative movement between the liquid confinement structure 12 and the substrate W and/or the speed of the relative movement. The purpose of this is to enable a faster passing of a height step, such as the edge of a substrate (gap G) underneath the liquid confinement structure 12, without having to slow down the relative speed between the liquid confinement structure 12 and substrate W. This is possible while also helping to prevent immersion liquid loss and maintaining the focus of the projection beam on the substrate W.

The focusing of projection beam is carried out assuming the liquid confinement structure 12 is at a certain fly height. The optimal fly height to cross the substrate edge is at a different fly height (because the fly height has an effect on the stability of the meniscus extending between liquid confinement structure 12 and the substrate and/or substrate table WT). Increasing the fly height can lead to liquid loss and may result in bubbles in the immersion liquid in the space 11. Thus, an embodiment of the invention is an optimization of both fly heights.

There may also be throughput benefits (for example, in an embodiment, about 7 substrates per hour) because the relative speed of movement between the liquid confinement structure 12 and the substrate W does not need to be decreased as much as in the situation where the liquid confinement structure 12 is not tilted.

Therefore, the controller 50 may tilt the liquid confinement structure 12 such that the bottom surface of the liquid confinement structure 12 is not parallel to the top surface of the substrate W and/or substrate table WT. That is, the bottom surface of the liquid confinement structure 12 may be angled away from being parallel to the top surface of the substrate W and/or substrate table WT.

U.S. patent application publication no. US 2005-0007569, hereby incorporated in its entirety by reference, describes a fluid handling structure (also known as an immersion hood) actuated so it can tilt and move vertically. This type of fluid handling structure can be used in an embodiment of the present invention.

The controller 50 may additionally change the distance between the bottom of the liquid confinement structure 12 and the surface of the substrate W and/or substrate table WT.

In an embodiment, the controller does not use a fixed fly height but, for example, varies fly height based on position or sensed fly height.

The method can be used when other features pass under the liquid confinement structure 12 for example during crossing a surface and/or approaching an edge of the surface such as approaching the gap between the substrate table and another object. In an embodiment the another object may be a sensor mounted on the substrate table WT or on a measurement table. The sensor may be a transmission image sensor (TIS), a lens interferometer sensor (ILIAS) or a spot sensor, for example. In an embodiment the another object is a bridge or bridging element. The bridging element may function as a dummy substrate present in a gap between at least two tables (for example, a substrate table and a measurement table or two substrate tables) during, for example, swapping of tables (e.g. two substrate tables or a substrate table for a measurement table) under the projection system PS. The bridging element may be attached to a table, for example at least during the duration during which the bridging element passes underneath the projection system PS. The bridging element is designed to allow the liquid confinement structure 12 to be maintained substantially full of immersion liquid during swapping of tables under the projection system PS. In an embodiment the bridging element may be part of another table such as a substrate table or a measurement table.

Figure 9:
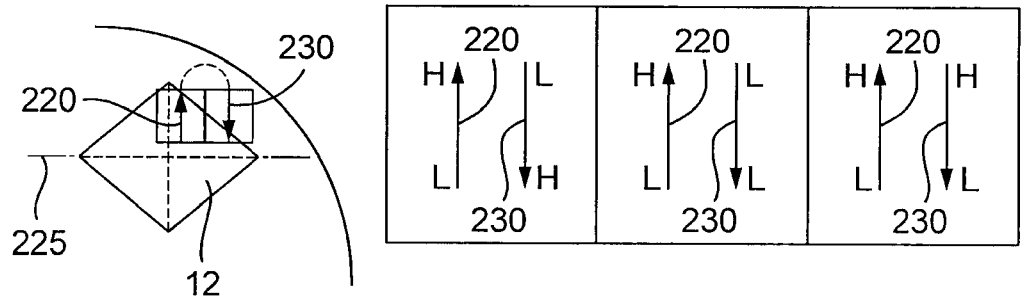
FIG. 9 illustrates different options for varying the tilt during backwards and forward movement of the substrate edge under a fluid handling system.

FIG. 9 illustrates one general principle of an embodiment of the invention. In an embodiment, during movement of the substrate W from under the liquid confinement structure 12 (illustrated by arrow 220—as in crossing of the liquid confinement structure 12 from over the substrate W to over the substrate table WT) an increased fly height H at the advancing side (top side as illustrated) of the liquid confinement structure 12 is present, for example always present. For example, the liquid confinement structure 12 may be rotated around axis 225. For the return crossing of the liquid confinement structure 12 back onto the substrate W (illustrated by arrow 230) there are three options, as illustrated in the boxes in FIG. 9: 1) the advancing side (bottom as illustrated) of the liquid confinement structure 12 can have its fly height increased (left hand option); 2) there can be no change in fly height at the advancing and trailing sides so that both sides have the same height (center option); or 3) the height of the trailing side can be increased (right hand option).

In an embodiment the liquid confinement structure 12 is only tilted for movements of the substrate relative to the liquid confinement structure 12 when the liquid confinement structure 12 is positioned at areas distal from the x and y axis. The origin of the x and y axes is the center of the substrate. The axes are substantially parallel and perpendicular to the scan direction. In an embodiment the liquid confinement structure 12 is only tilted for movements when the liquid confinement structure passes off and/or onto the substrate W.

In an embodiment the substrate W moves relative to and under the liquid confinement structure 12 so that the exposure beam images a row of dies extending one after another in a first direction. Then an adjacent row of dies extending in the first direction is imaged. In this case rotation may only be around an axis parallel to the first direction of the liquid confinement structure 12. In an embodiment rotation about the orthogonal direction to the first direction may also or alternatively be used.

Figure 10:
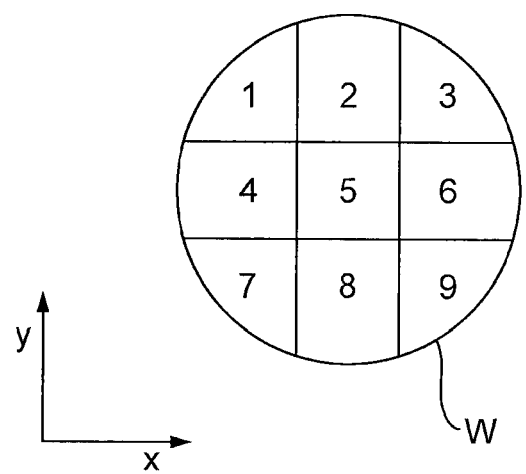
FIG. 10 illustrates a definition of die numbers for an exemplary set of rules for varying the tilt.

FIG. 10 illustrates a system in which the rotation of the liquid confinement structure is dependent upon which segment of the substrate W is being imaged. FIG. 10 shows, in plan, a substrate W which is split into segments 1-9. The tilt can be determined according to which sector 1-9 is being imaged. For example, tilt may only be induced during imaging of segments 1, 3, 7 and/or 9.

The below lines of code are an exemplary embodiment of how the tilt about the x direction (Rx) and about the y direction (Ry) is adjusted according to which segment 1-9 is being imaged and according to in which direction there is relative movement between the substrate W and the liquid confinement structure 12. The origin is in the center of the substrate, $v_y$ is the relative velocity between the substrate W and the liquid confinement structure 12 in the y direction.

```
if (v_y>0 AND y > 0) OR (v_y<0 AND y<0)
    Rx_tilt=Rx_tilt_W2C,
else
    Rx_tilt=Rx_tilt_C2W
End
1: Rx = Rx_tilt * sign(v_y); Ry = Ry_tilt
2: Rx = Rx_tilt * sign(v_y); Ry = 0
3: Rx = Rx_tilt * sign(v_y); Ry = -Ry_tilt
4: Rx = 0; Ry = Ry_tilt
5: Rx = 0; Ry = 0
6: Rx = 0; Ry = -Ry_tilt
7: Rx = Rx_tilt * sign(v_y); Ry = Ry_tilt
8: Rx = Rx_tilt * sign(v_y); Ry = 0
9: Rx = Rx_tilt * sign(v_y); Ry = -Ry_tilt
```

Per area z_offset should be determined by:

$$\text{Tilt} = \max(|Rx|, |Ry|)$$

$$z\_offset = z\_user + tilt*44.5 \; [\mu m/mrad]$$

wherein Rx_tilt_W2C is a tilt for motion off the substrate W (direction 220) and Rx_tilt_C2W is a tilt for motion onto the substrate W (direction 230). In both cases the leading edge of the liquid confinement system has a higher fly height than the trailing edge.

Figure 11:
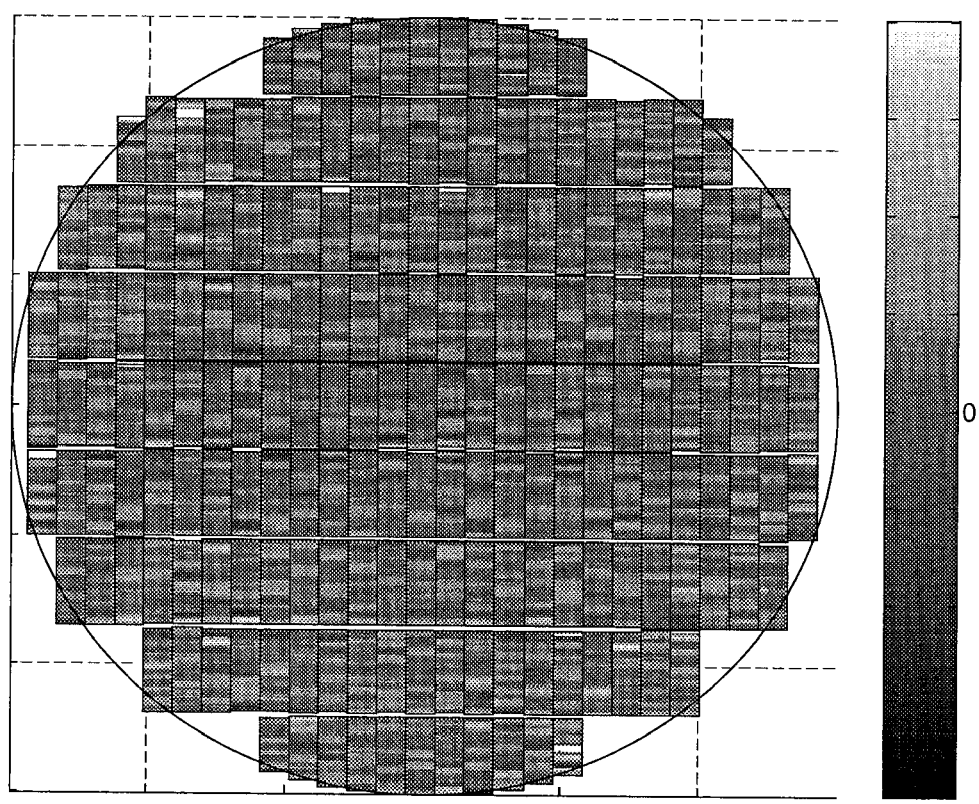
FIG. 11 illustrates results like that of FIG. 7 using an embodiment of the present invention.

FIG. 11 illustrates the results equivalent to the results of FIG. 7 except that an embodiment of the invention has been practiced. In this experiment the following conditions were applied:

For a move from the substrate W to the substrate table WT: 1 mrad tilt in Rx, i.e. advancing side of liquid confinement structure 12 flies at a predetermined distance (e.g. 250 μm), and receding at a predetermined distance (e.g. 150 μm) (i.e. the nominal fly height).

For a move from the substrate table WT to substrate W: 1 mrad tilt in Rx, i.e. advancing side of the liquid confinement structure 12 flies at a predetermined distance (e.g. 250 μm), and receding at a predetermined distance (e.g. 150 μm) (i.e. the nominal fly height).

A positive tilt is defined as the advancing side of the liquid confinement structure 12 is higher than the receding side.

No tilt in Ry.

The fly height of the center of the liquid confinement structure 12 is increased with a tilt to ensure that the lowest point of the liquid confinement structure 12 is always at a predetermined distance (e.g. 150 μm).

That means that the liquid confinement structure 12 flips during the step move from one field to next when it moves over the substrate edge.

As can be seen from FIG. 11, the number of fields with a high servo error in z direction has decreased compared to FIG. 7. The mean off-set for all of the dies shows an improvement of about 25% and peak servo off-set is reduced by about 8%.

Figure 12:
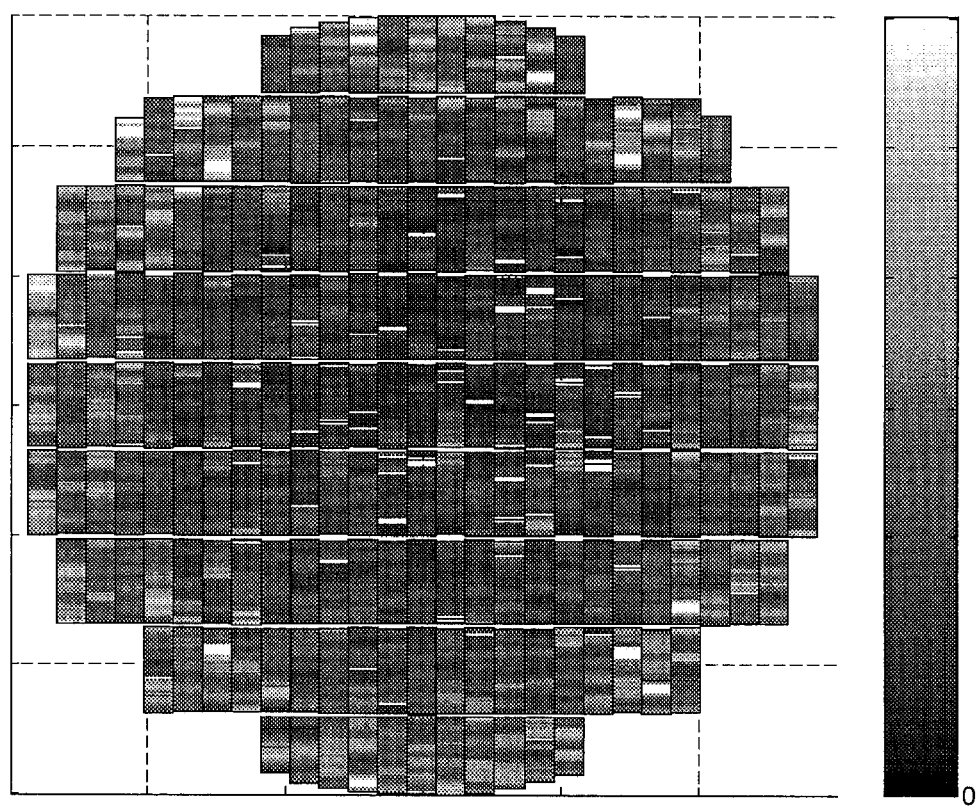
FIGS. 12 and 13 illustrate variations in the standard deviation of the substrate table servo error in the z direction when not using an embodiment of the invention and when using an embodiment of the invention respectively.
Figure 13:
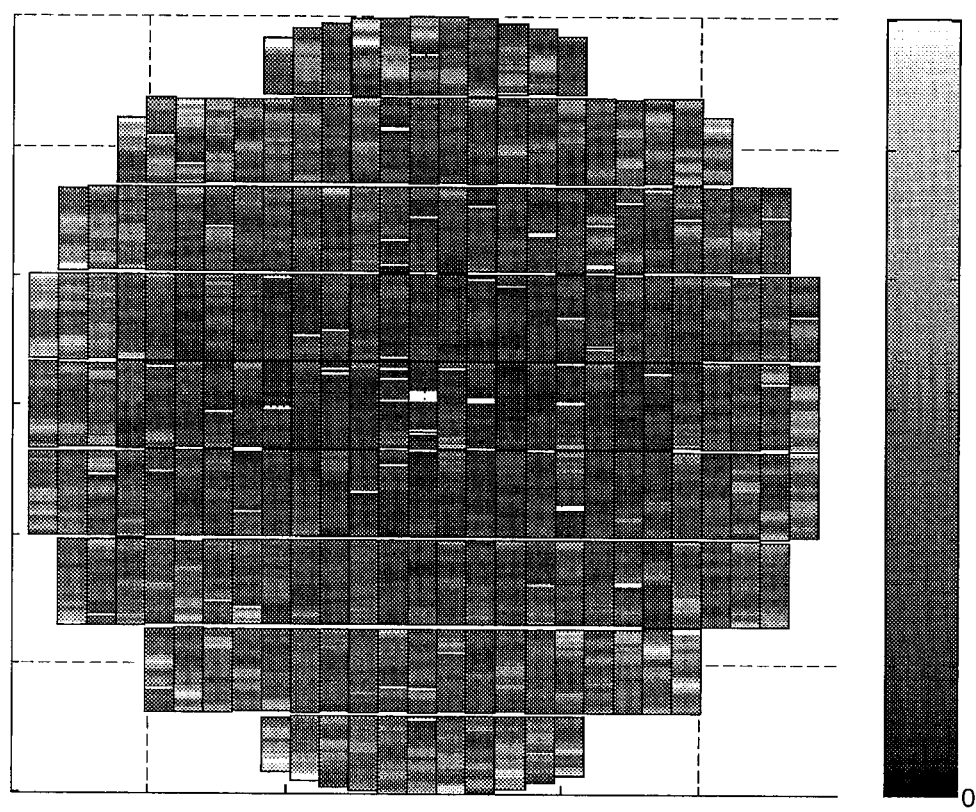

FIGS. 12 and 13 show the standard deviations of FIGS. 7 and 11 respectively. From these Figures the improvement can be seen, particularly in the reduced standard deviations in the dies affected by defocus resulting from passing of the gap G under the liquid confinement system. The improvement can be seen by the lower variation from zero (resulting in the affected dies being darker) of dies at the top two corners just in from the substrate edge and in a region around the bottom of the substrate just in from the substrate edge.

Figure 14:
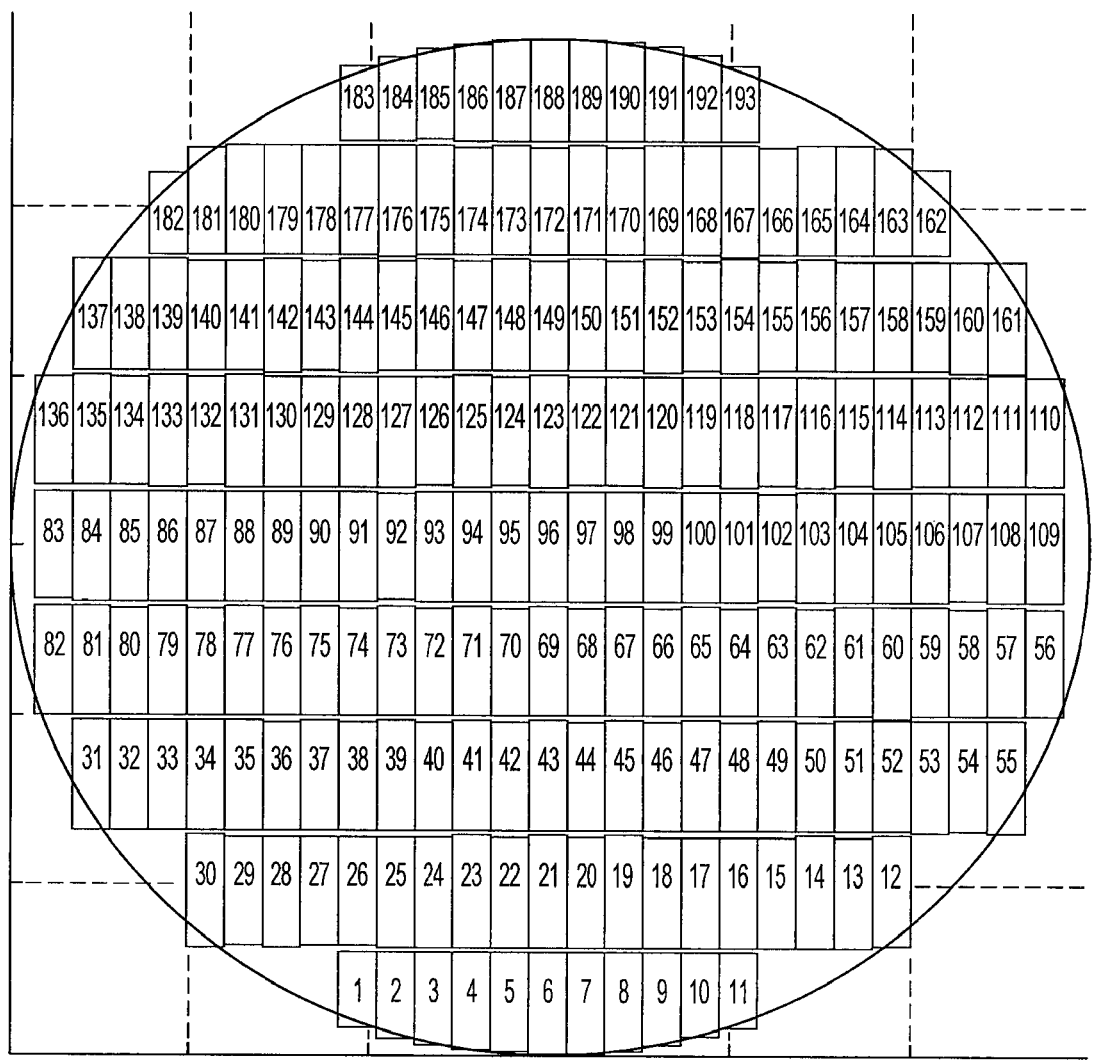
FIG. 14 illustrates a substrate, in plan, with each of the fields labeled with a number.

FIG. 14 is an illustration, in plan, of the fields of a substrate W. Each field is numbered. Fields particularly prone to the defocus errors discussed in this application are fields 165, 157 and 179, for example.

Figure 15:
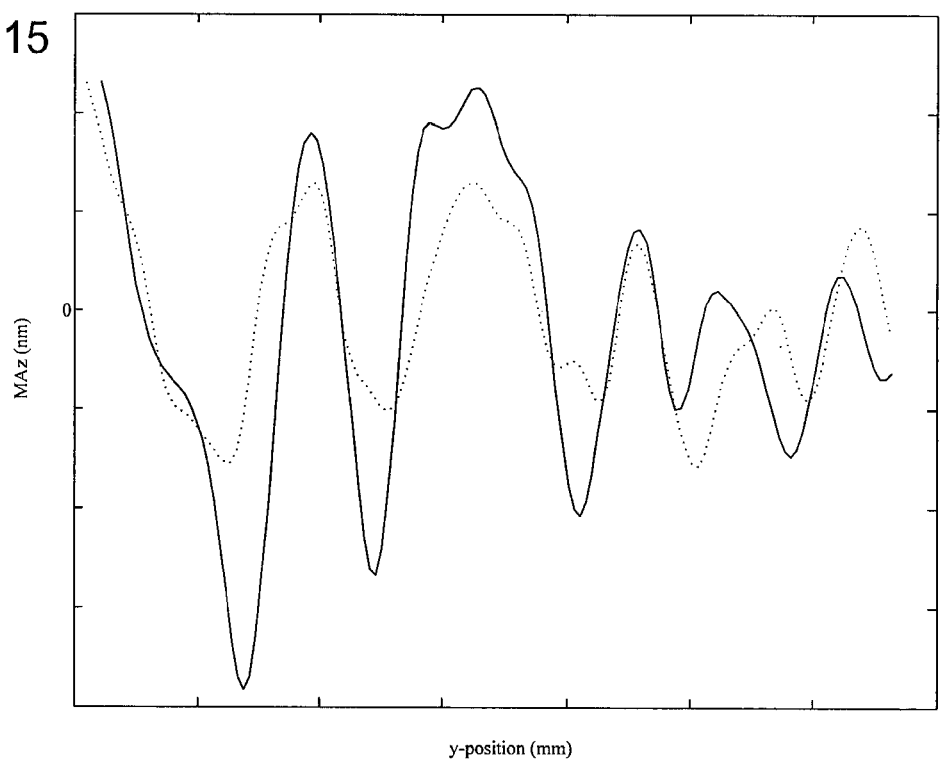
FIGS. 15-17 illustrate cross-sections of selected fields of the substrate table servo error in the z direction both using and not using an embodiment of the present invention.
Figure 16:
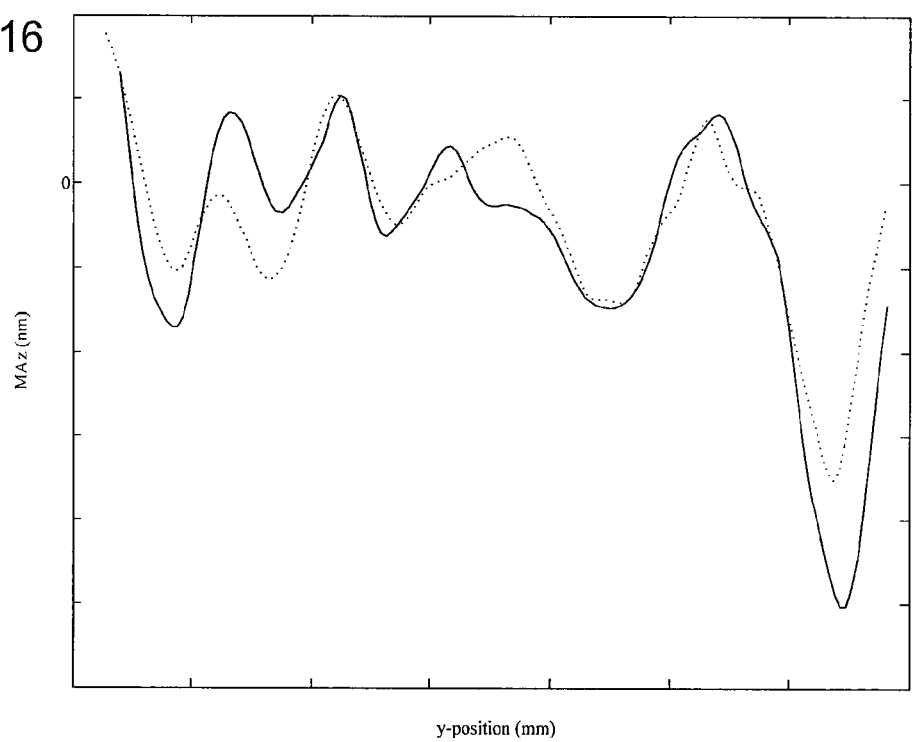
Figure 17:
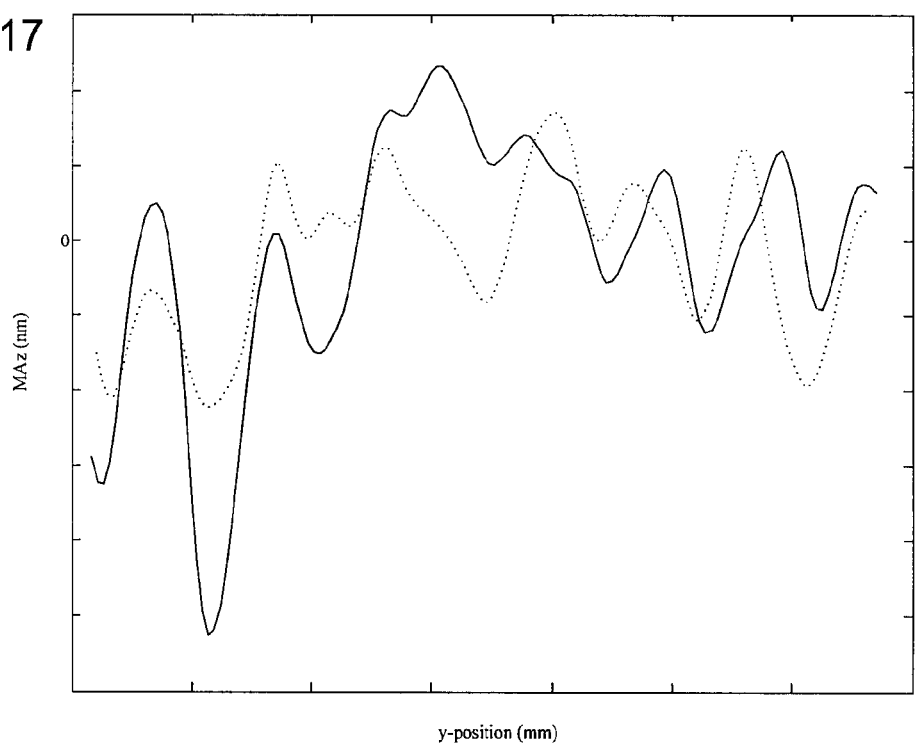
Figure 18:
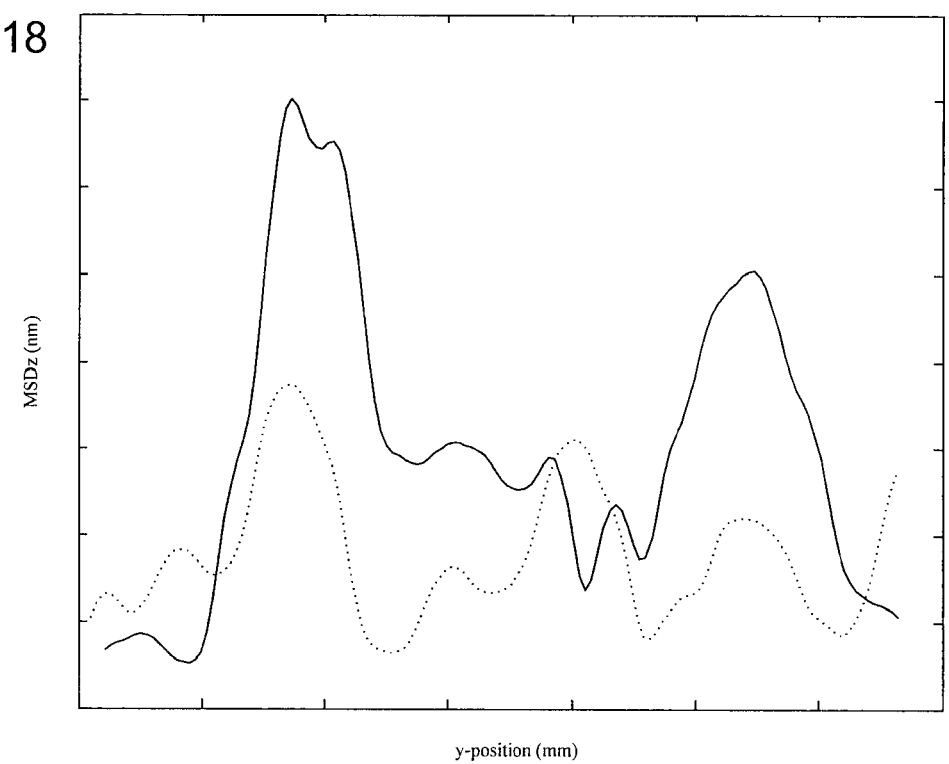
FIGS. 18-20 illustrate cross-sections of selected fields of the standard deviation of the substrate table servo error in the z direction both using and not using an embodiment of the present invention.
Figure 19:
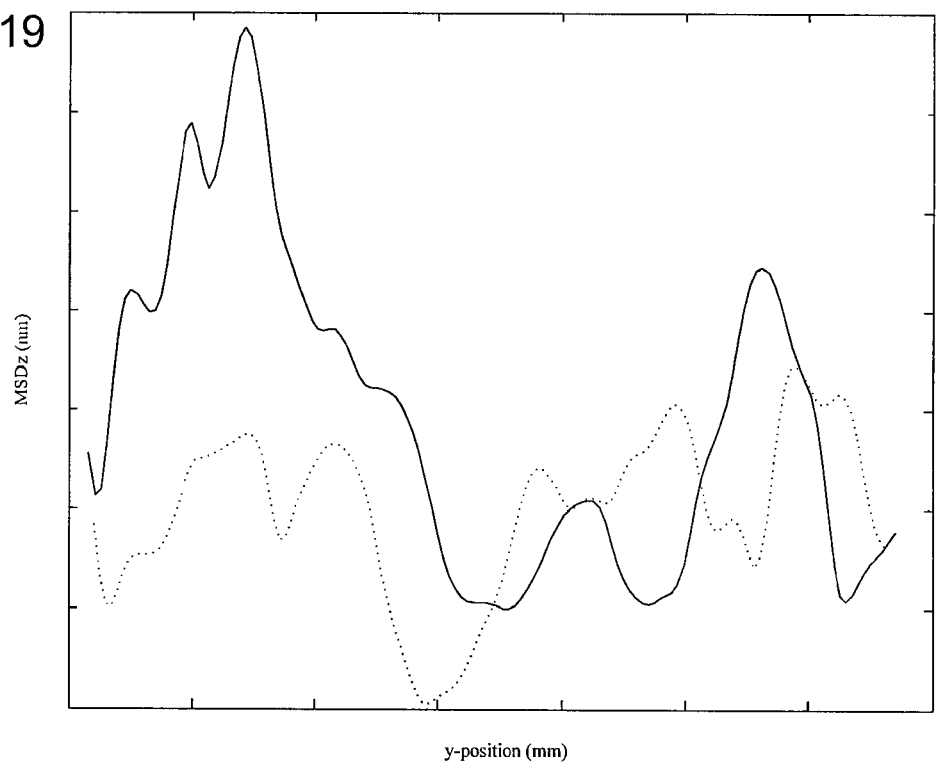
Figure 20:
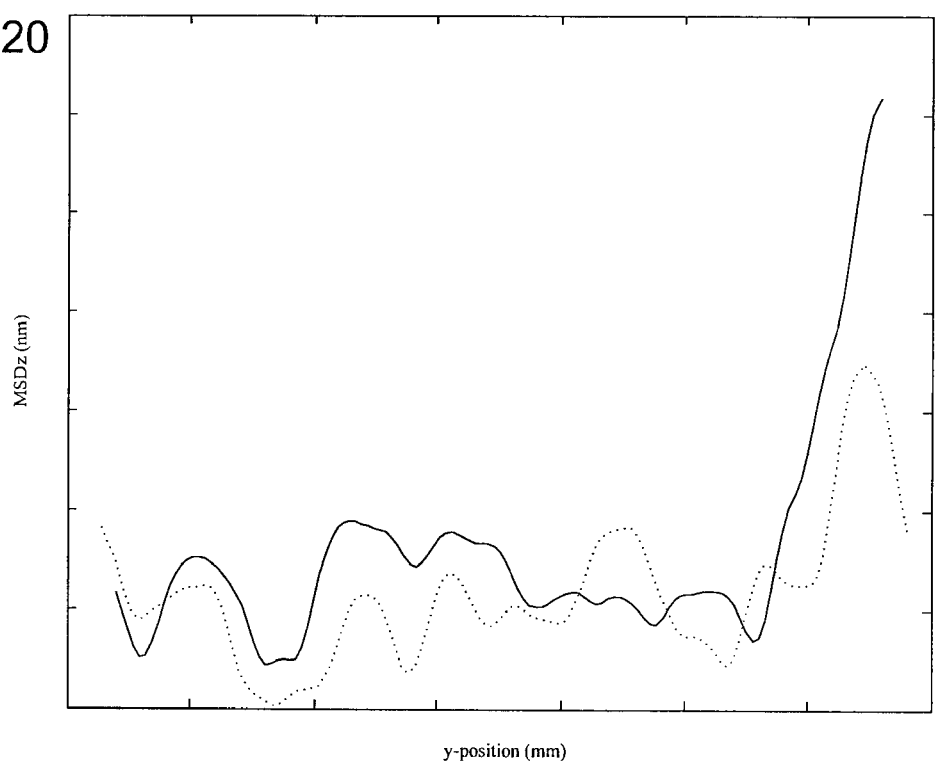

FIGS. 15-17 show the variation in servo off-set in the z direction of the substrate table W for fields 165, 157 and 179 respectively varying with y position for both a reference (solid line) in which an embodiment of the present invention is not applied (i.e. no tilt) and for an embodiment (dotted line) of the present invention (i.e. where a tilt is applied in accordance with the system outlined above). FIGS. 18-20 show the change in the moving standard deviation for the same fields for both a reference (solid line) in which an embodiment of the present invention is not applied (i.e. no tilt) and for an embodiment (dotted line) of the present invention (i.e. where a tilt is applied in accordance with the system outlined above).

As can be seen, the results generated with an embodiment of the present invention result in lower servo error compared with the reference (where there is no tilt of the bottom surface of the liquid confinement structure 12 relative to the substrate W surface). The magnitude of the variation, for example the sizes of the peaks and troughs, are smaller.

The moving standard deviation servo error is smaller with an embodiment of the present invention compared to the reference values. The peaks (namely the magnitude of the variation) are also smaller for an embodiment of the present invention.

In an embodiment the axis or axes of rotation and/or magnitude(s) of rotation angle of the liquid confinement structure 12 relative to the top surface of the substrate W is determined based on the relative position of the substrate W to the liquid confinement structure 12. The relative position may be the position of a portion of the edge of the substrate W relative to the optical axis of the projection system PS. Additionally or alternatively the axis or axes of rotation and/or magnitude(s) of rotation angle may be determined based on the relative direction of movement of a portion of the edge of the substrate W relative to the optical axis of the projection system PS. In the above mentioned embodiments, the portion of the edge of the substrate may be a portion of an edge of the substrate W closest to the optical axis or the projection system PS. In an embodiment the determination of the axis or axes of rotation (and/or magnitude(s) of rotation angle) is dependent upon one or more properties of a tangent to the portion of the edge of the substrate W. For example, the determination may be based on an angle which the tangent makes to a scan and/or a step direction of the apparatus. For example, the axis or axes and magnitude(s) may be selected on the basis of the angle of the tangent relative to the scan and/or step directions being within a certain (e.g., pre-determined) range. On this basis it is possible to select during scanning of which dies tilt of the liquid confinement structure 12 relative to the substrate W occurs. For example, from FIG. 7, it can be seen that if the tangent of the portion of the edge of the substrate closest to the optical axis of the projection system PS is about 45° relative to the scan and/or step directions (say between 30 and 60° or between 35 and 55°), and tilt is induced in this range, tilting will occur during scanning of the dies with the greatest servo off-set. In an embodiment the tangent of the portion is in a plane of the substrate and/or perpendicular to the optical axis.

Figure 21:
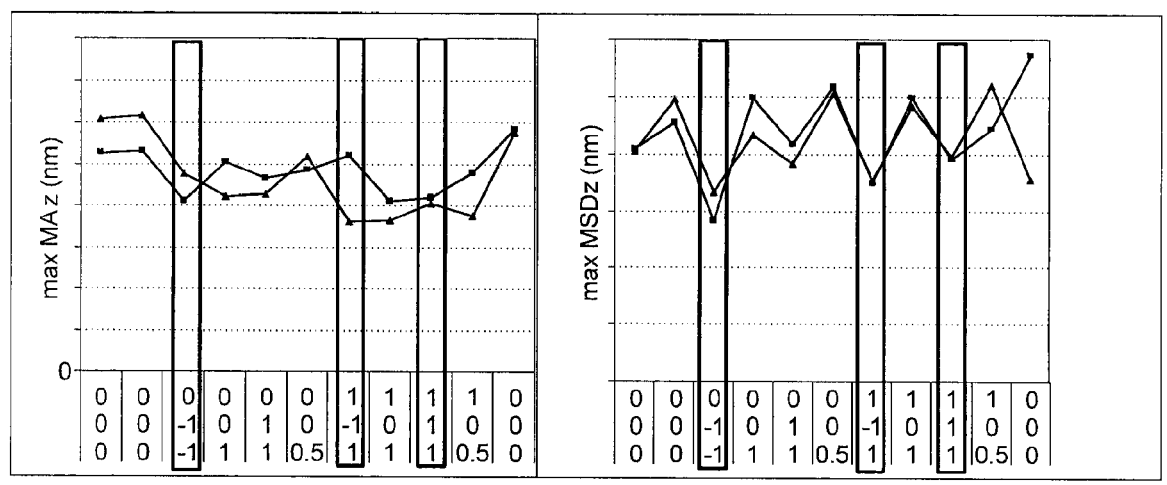
FIG. 21 illustrates the maximum of the substrate table servo error in the z direction and maximum standard deviation of the servo error in the z direction of all fields of a substrate for various parameters of tilt.

FIG. 21 illustrates the results for different settings of tilt during imaging of dies affected by the defocus (shown in FIG. 22 and explained below). The settings in mrad are shown below the graphs in FIG. 21 in rectangles comprising at the top the tilt in the Ry direction, then in the middle the Rx direction tilt during an inward motion (i.e. onto the substrate W in direction 230), and at the bottom the Rx direction tilt during an outward motion (i.e. off the substrate W in direction 220). The maximum servo off-set for any of the dies affected by defocus is plotted above the corresponding setting in the left hand graph. The maximum moving standard deviation for any of the dies affected by defocus is plotted above the corresponding setting in the right hand graph of FIG. 21. The results shown as squares are for a first layer and the results shown as triangles are for a second layer. The only difference between the two layers is the scan direction. Plotting results for both layers indicates the reproducibility of the results.

Figure 22:
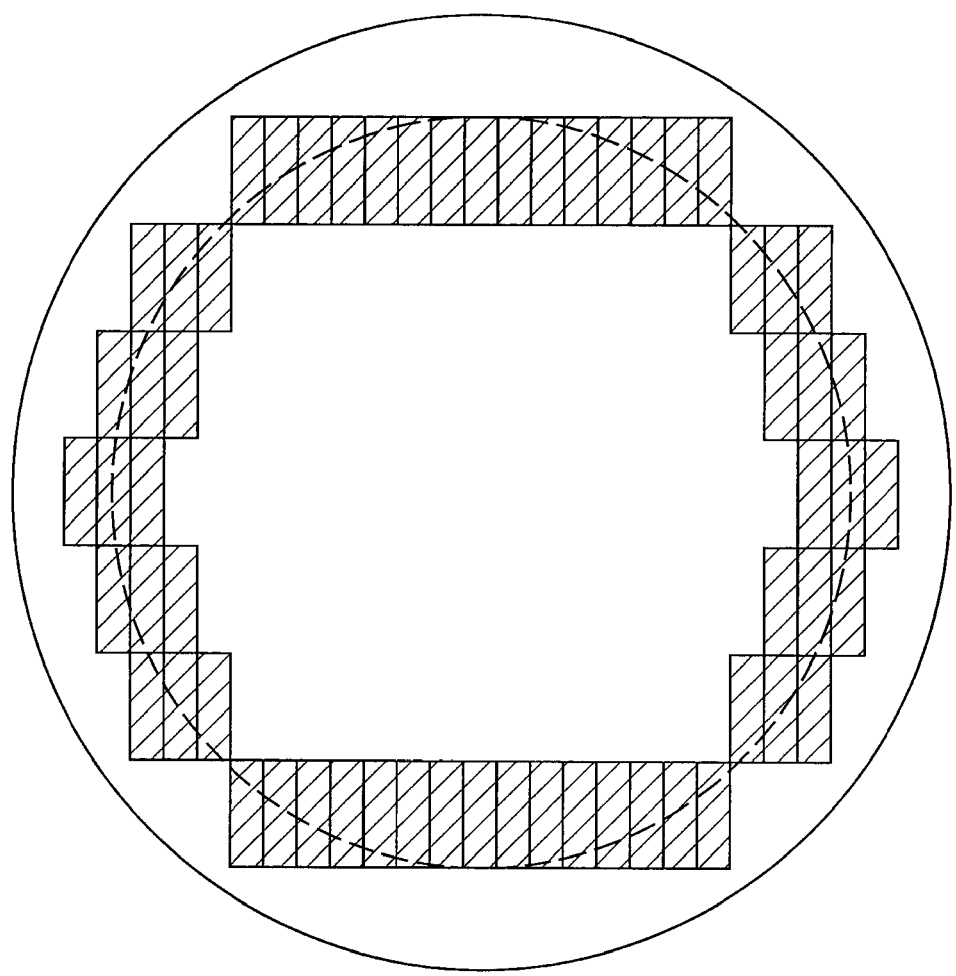
FIG. 22 illustrates three different types of die.

FIG. 22 shows the dies affected by defocus for which tilt is induced to obtain the results shown in FIG. 21. The dies affected by defocus are the dies between the central part of the substrate W and the outer dies (i.e. they are the dies with diagonal lines in them in FIG. 22).

As can be seen, certain settings of tilt (shown below the graphs in FIG. 21 in rectangles) result in the lowest servo off-set (left hand graph) and lowest moving standard deviation (right hand graph). The best results are achieved by tilting the liquid confinement structure about the x axis. Tilting the liquid confinement structure 12 additionally around the y axis also helps in certain circumstances. In an embodiment the controller 50 decides independently whether to tilt the liquid confinement structure 12 about the x axis and/or the y axis.

The below table summarizes the results of the best settings for tilt with the results normalized relative to the reference (no tilt value).

|  | Max MA-z | Max MSD-z |
| --- | --- | --- |
| Reference | 1 | 1 |
| SBP setting 1:<br>Rx_i = Rx_o = 1 mrad<br>Ry = 0 | 0.7, 0.76 | 0.62, 0.73 |
| SBP setting 5:<br>Rx_i = Rx_o = 1 mrad<br>Ry = 1 mrad | 0.87, 0.6 | 0.78, 0.78 |

-continued

|  | Max MA-z | Max MSD-z |
|---|---|---|
| SBP setting 7:<br>Rx_i = Rx_o = −1 mrad<br>Ry = 1 mrad | 0.7, 0.67 | 0.87, 0.89 |

An embodiment of the present invention could also be used to improve defectivity performance on dies other than those described above. For instance, the tilt of the liquid confinement structure may be controlled at or near dies at which bubble defects occur. These defects result from collision of liquid left behind on the substrate W during a previous move, such as a droplet, with a meniscus extending between the substrate W and the liquid confinement structure 12. The collision can result in gas between the droplet and the meniscus becoming trapped in the immersion liquid within the meniscus. The gas thus forms a bubble in the immersion liquid and thereby increases the risk of imaging errors. During movement of the liquid confinement structure 12 relative to the substrate W at locations at which droplets are otherwise left behind or on subsequent movement at those positions, tilting can be induced and otherwise controlled for example as described above. Such tilting of the liquid confinement structure may improve the situation by reducing the chance of bubble formation. Tilting the liquid confinement structure 12 at the locations at which droplets can be produced may result in fewer droplets being generated. The fly height may additionally or alternatively be decreased to decrease the chance of creating a bubble during a potential collision between a droplet left behind on the top surface of the substrate W and/or substrate table WT in collision with a meniscus extending between the substrate W and/or substrate table WT and the liquid confinement structure 12.

The controller 50 may additionally require a further condition to be met in order to adjust the one or more operating conditions (e.g. tilt and/or fly height) even if the imaging or stepping occurs near to the substrate edge. For example, a precondition for adjusting an operating condition during imaging may be that the imaging "movement" is on or off the substrate or towards the X axis of the substrate W and not away from the X axis of the substrate W. This may be advantageous because scans onto a substrate W or just on a substrate W may tend to result in more defects than scans off a substrate W or moving closer to the edge of a substrate W.

The above description refers to a "die". This description could alternatively refer to an exposure field. An exposure field could include several dies. A die is typically one customer product.

In an embodiment, there is provided an immersion lithographic apparatus comprising: a substrate table configured to support a substrate; a projection system configured to direct a patterned beam of radiation onto a substrate; a liquid handling system configured to supply and confine immersion liquid to a space defined between the projection system and a substrate, or the substrate table, or both; a controller to adjust an angle of a lower surface of the liquid handling system relative to the top surface of the substrate during motion of the substrate and/or substrate table relative to the liquid handling system dependent upon a position of the substrate and/or substrate table relative to the liquid handling system and/or a direction of relative movement between the substrate and/or substrate table and the liquid handling system. In an embodiment, the angle is adjusted such that a leading edge of the liquid handling system is further from the top surface of the substrate and/or substrate table than a trailing edge of the liquid handling system. In an embodiment, the angle is adjusted for when an edge of the substrate move to or from under the liquid handling system. In an embodiment, the angle is adjusted such that the leading edge of the liquid handling system is further from the top surface of the substrate and/or substrate table than a trailing edge of the liquid handling system when the substrate moves away from under the liquid handling system. In an embodiment, the angle is adjusted such that the leading edge of the liquid handling system is further from the top surface of the substrate and/or substrate table than a trailing edge of the liquid handling system when the substrate moves to under the liquid handling system. In an embodiment, the angle is adjusted such that a leading edge of the liquid handling system is nearer to a top surface of the substrate and/or substrate table than a trailing edge of the liquid handling system when an edge of the substrate moves to under the liquid handling system. In an embodiment, the angle is adjusted such that the leading edge of the liquid handling system is nearer to the top surface of the substrate and/or substrate table than a trailing edge of the liquid handling system when the liquid handling system becomes located over the substrate. In an embodiment, a smallest distance between the liquid handling system and the top surface of the substrate and/or substrate table is maintained substantially constant during the motion. In an embodiment, the motion comprises imaging at least two rows of fields one after another. In an embodiment, the angle is generated by rotation of the liquid handling system about a direction parallel to the direction in which the rows of fields extend. In an embodiment, the angle is adjusted dependent upon the field being imaged and/or which fields are being moved between. In an embodiment, the angle is adjusted according to the relative velocity between the liquid handling system and the substrate table. In an embodiment, the angle is increased when the position is for imaging of fields during which variations in force between the liquid handling system and substrate are above a certain magnitude. In an embodiment, the axis/axes of rotation and/or magnitude(s) of rotation angle is determined based on the position and/or the direction. In an embodiment, the axis/axes of rotation and/or magnitude(s) of rotation angle is determined based on the position of a portion of the edge of the substrate relative to the optical axis of the projection system. In an embodiment, the axis/axes of rotation and/or magnitude(s) of rotation angle is determined based on the relative direction of movement of a portion of the edge of the substrate relative to the optical axis of the projection system. In an embodiment, the portion of the edge of the substrate is an edge of the substrate closest to the optical axis of the projection system. In an embodiment, the determination of the axis/axes of rotation and/or magnitude(s) of rotation angle is dependent on a property of a tangent to the portion of the edge of the substrate. In an embodiment, the tangent of the portion of the edge of the substrate is in the plane of the substrate, perpendicular to the optical axis, or both.

In an embodiment, there is provided a method of operating a lithographic apparatus, the method comprising: moving a substrate table supporting a substrate relative to a projection system configured to project a patterned beam of radiation through immersion liquid confined by a liquid handling system onto a substrate; and adjusting an angle of a lower surface of the liquid handling system relative to the top surface of the substrate during motion of the substrate and/or substrate table relative to the liquid handling system dependent upon a position of the substrate and/or substrate table relative to the liquid handling system and/or a direction of relative movement between the substrate and/or substrate table and the liquid handling system.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus comprising:
a substrate table configured to support a substrate;
a projection system configured to direct a patterned beam of radiation onto a substrate;
a liquid handling system configured to supply and confine immersion liquid to a space defined between the projection system and a substrate, or the substrate table, or both; and
a controller to adjust an angle of a lower surface of the liquid handling system relative to the top surface of the substrate for during motion of the substrate and/or substrate table relative to the liquid handling system, dependent upon a position of the substrate and/or substrate table relative to the liquid handling system and/or a direction of relative movement between the substrate and/or substrate table and the liquid handling system, wherein the angle is adjusted such that a leading edge of the liquid handling system is further from the top surface of the substrate and/or substrate table than a trailing edge of the liquid handling system.

2. The immersion lithographic apparatus of claim 1, wherein the angle is adjusted for when an edge of the substrate moves to, or from under, the liquid handling system.

3. The immersion lithographic apparatus of claim 1, wherein the angle is adjusted such that the leading edge of the liquid handling system is further from the top surface of the substrate and/or substrate table than a trailing edge of the liquid handling system when the substrate moves away from under the liquid handling system.

4. The immersion lithographic apparatus of claim 1, wherein the angle is adjusted such that the leading edge of the liquid handling system is further from the top surface of the substrate and/or substrate table than a trailing edge of the liquid handling system when the substrate moves to under the liquid handling system.

5. An immersion lithographic apparatus comprising:
a substrate table configured to support a substrate;
a projection system configured to direct a patterned beam of radiation onto a substrate;
a liquid handling system configured to supply and confine immersion liquid to a space defined between the projection system and a substrate, or the substrate table, or both; and
a controller to adjust an angle of a lower surface of the liquid handling system relative to the top surface of the substrate for during motion of the substrate and/or substrate table relative to the liquid handling system, dependent upon a position of the substrate and/or substrate table relative to the liquid handling system and/or a direction of relative movement between the substrate and/or substrate table and the liquid handling system, wherein the angle is adjusted such that a leading edge of the liquid handling system is nearer to a top surface of the substrate and/or substrate table than a trailing edge of the liquid handling system when an edge of the substrate moves to under the liquid handling system.

6. The immersion lithographic apparatus of claim 5, wherein the angle is adjusted such that the leading edge of the liquid handling system is nearer to the top surface of the substrate and/or substrate table than a trailing edge of the liquid handling system when the liquid handling system becomes located over the substrate.

7. The immersion lithographic apparatus of claim 1, wherein a smallest distance between the liquid handling system and the top surface of the substrate and/or substrate table is maintained substantially constant during the motion.

8. The immersion lithographic apparatus of claim 1, wherein the motion comprises imaging at least two rows of fields one after another.

9. The immersion lithographic apparatus of claim 8, wherein the angle is generated by rotation of the liquid handling system about a direction parallel to the direction in which the rows of fields extend.

10. The immersion lithographic apparatus of claim 1, wherein the angle is adjusted dependent upon the field being imaged and/or which fields are being moved between.

11. The immersion lithographic apparatus of claim 1, wherein the angle is adjusted according to the relative velocity between the liquid handling system and the substrate table.

12. The immersion lithographic apparatus of claim 1, wherein the angle is increased when the position is for imaging of fields during which variations in force between the liquid handling system and substrate are above a certain magnitude.

13. The immersion lithographic apparatus of claim 1, wherein the axis/axes of rotation and/or magnitude(s) of rotation angle is determined based on the position and/or the direction.

14. The immersion lithographic apparatus of claim 13, wherein the axis/axes of rotation and/or magnitude(s) of rotation angle is determined based on the position of a portion of the edge of the substrate relative to the optical axis of the projection system.

15. The immersion lithographic apparatus of claim 13, wherein the axis/axes of rotation and/or magnitude(s) of rotation angle is determined based on the relative direction of movement of a portion of the edge of the substrate relative to the optical axis of the projection system.

16. The immersion lithographic apparatus of claim 14, wherein the portion of the edge of the substrate is an edge of the substrate closest to the optical axis of the projection system.

17. The immersion lithographic apparatus of claim 14, wherein the determination of the axis/axes of rotation and/or magnitude(s) of rotation angle is dependent on a property of a tangent to the portion of the edge of the substrate.

18. The immersion lithographic apparatus of claim 17, wherein the tangent of the portion of the edge of the substrate is in the plane of the substrate, perpendicular to the optical axis, or both.

19. A method of operating a lithographic apparatus, the method comprising:
moving a substrate table supporting a substrate relative to a projection system configured to project a patterned beam of radiation through immersion liquid confined by a liquid handling system onto a substrate; and
adjusting an angle of a lower surface of the liquid handling system relative to the top surface of the substrate for during motion of the substrate and/or substrate table relative to the liquid handling system, dependent upon a position of the substrate and/or substrate table relative to the liquid handling system and/or a direction of relative movement between the substrate and/or substrate table and the liquid handling system, wherein the angle is adjusted such that a leading edge of the liquid handling system is further from the top surface of the substrate and/or substrate table than a trailing edge of the liquid handling system.

* * * * *